United States Patent
Arao

(10) Patent No.: US 8,288,810 B2
(45) Date of Patent: Oct. 16, 2012

(54) SEMICONDUCTOR DEVICE AND MANUFACTURING METHOD THEREOF

(75) Inventor: Takashi Arao, Tokyo (JP)

(73) Assignee: Elpida Memory, Inc, Tokyo (JP)

( * ) Notice: Subject to any disclaimer, the term of this patent is extended or adjusted under 35 U.S.C. 154(b) by 91 days.

(21) Appl. No.: 12/868,104

(22) Filed: Aug. 25, 2010

(65) Prior Publication Data

US 2011/0057239 A1 Mar. 10, 2011

(30) Foreign Application Priority Data

Sep. 7, 2009 (JP) ................................. 2009-205862

(51) Int. Cl.
*H01L 27/108* (2006.01)
*H01L 29/76* (2006.01)

(52) U.S. Cl. ............ 257/296; 257/295; 257/532; 438/3; 438/239

(58) Field of Classification Search .......... 257/295–296, 257/532, E27.016, E29.343, E21.008; 438/3, 438/239

See application file for complete search history.

(56) References Cited

U.S. PATENT DOCUMENTS 5,838,035 A * 11/1998 Ramesh ........................ 257/295

FOREIGN PATENT DOCUMENTS

| JP | 2003-133438 | 5/2003 |
| JP | 2007-201083 | 8/2007 |
| JP | 2007-318147 | 12/2007 |
| JP | 2009-059889 | 3/2009 |
| WO | WO 2006/068453 | 6/2006 |

* cited by examiner

*Primary Examiner* — Theresa T Doan
(74) *Attorney, Agent, or Firm* — Young & Thompson

(57) ABSTRACT

A semiconductor device comprises a capacitor in which a lower electrode, an adhesive layer, a capacitance insulating film, and an upper electrode are provided in series. The capacitance insulating film has laminated films in which a first metal oxide film and a second metal oxide film are alternatively laminated so that the first metal oxide film contacts with the adhesive layer. The adhesive layer has thickness of 0.3 nm or more and is an oxide film including at least one element selected from element contained in the lower electrode.

22 Claims, 12 Drawing Sheets

SEMICONDUCTOR DEVICE AND MANUFACTURING METHOD THEREOF

This application is based upon and claims the benefit of priority from Japanese Patent Application No. 2009-205862, filed on Sep. 7, 2009, the disclosure of which is incorporated herein in its entirety by reference.

BACKGROUND OF THE INVENTION

1. Field of the Invention

The present invention relates to a semiconductor device and a manufacturing method thereof.

2. Description of the Related Art

As semiconductor devices are micro-fabricated, for example, in a device with a capacitor mounted therein such as a DRAM element, means capable of not reducing the capacitance of the capacitor has been required. With regard to one of such means, a capacitance insulating film (dielectric film) having high permittivity has been developed. Japanese Patent Laid-Open No. 2007-318147 discloses metal oxides such as titanium oxide ($TiO_2$) or zirconium oxide ($ZrO_2$) as a capacitance insulating film having high permittivity for a capacitor.

If this film is applied to a capacitor, small leakage current, as well as high permittivity, is important. As disclosed in Japanese Patent Laid-Open No. 2009-059889 and Japanese Patent Publication No. 2008-526017, there has been proposed a method of laminating an insulating film consisting of a plurality of materials in order to reduce leakage current.

In addition, as disclosed in Japanese Patent Laid-Open No. 2007-201083, there has been proposed a method of oxidizing a surface of a lower layer prior to depositing an insulating film to improve a leakage current characteristic.

SUMMARY OF THE INVENTION

In one embodiment, there is provided a semiconductor device comprising:
a capacitor including a lower electrode, an adhesive layer, a capacitance insulating film, and an upper electrode in this order,
wherein the capacitance insulating film includes laminated films, in which a first metal oxide film and a second metal oxide film are alternatively laminated such that the first metal oxide film contacts with the adhesive layer, and
the adhesive layer has thickness of 0.3 nm or more and is an oxide film including at least one element selected from elements contained in the lower electrode.

In another embodiment, there is provided a semiconductor device comprising a capacitor,
the capacitor comprising:
a lower electrode;
an adhesive layer on the lower electrode;
a first metal oxide film on the adhesive layer;
a second metal oxide film on the first metal oxide film; and
an upper electrode on the second metal oxide film,
wherein the adhesive layer is an oxide film including at least one element selected from elements contained in the lower electrode, a thickness of the adhesive layer being in range from 0.3 nm to 1.0 nm.

In another embodiment, there is provided a method for manufacturing a semiconductor device comprising a capacitor, the method comprising:
forming a lower electrode;
forming an adhesive layer and a first metal oxide film in this order on the lower electrode by using ALD method, the adhesive layer having thickness of 0.3 nm or more and being an oxide film including at least one element selected form elements contained in the lower electrode;
forming a second metal oxide film on the first metal oxide film by using ALD method;
laminating the first metal oxide film and the second metal oxide film alternatively on the second metal oxide film by using ALD method, to form a capacitance insulating film including laminated films of the first metal oxide film and the second metal oxide film; and
forming an upper electrode on the capacitance insulating film.

BRIEF DESCRIPTION OF THE DRAWINGS

The above features and advantages of the present invention will be more apparent from the following description of certain preferred embodiments taken in conjunction with the accompanying drawings, in which.

Figure 1:
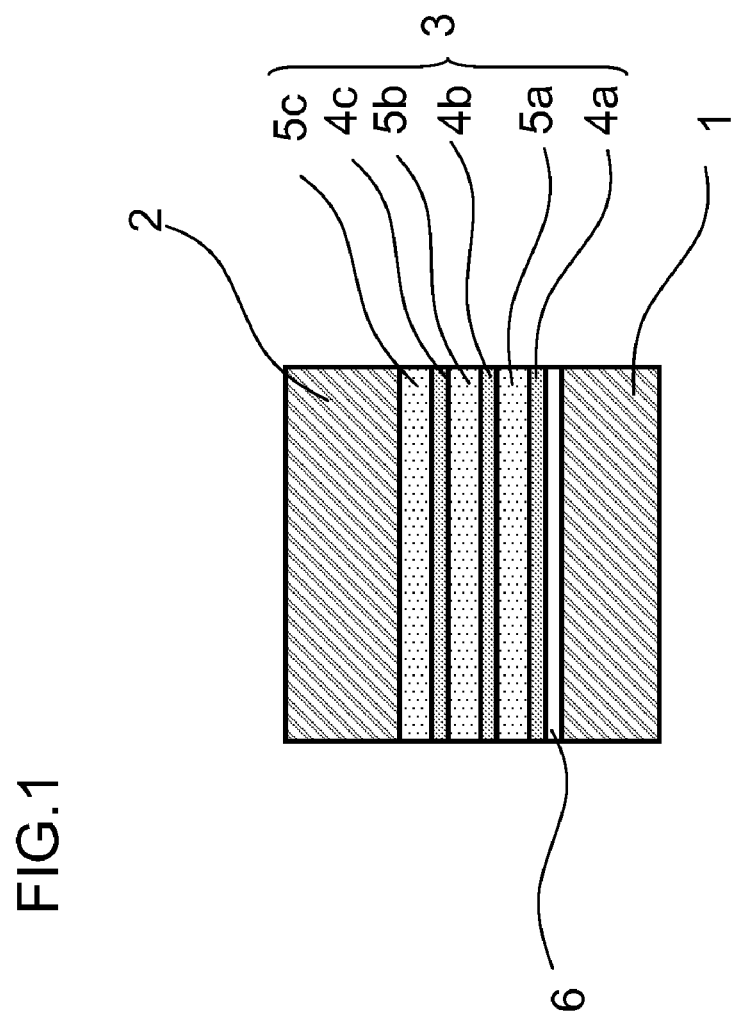
FIG. 1 is a cross-sectional view of a semiconductor device of a first exemplary embodiment.

In the drawings, reference numerals have the following meanings: 1: lower electrode; 2: upper electrode; 3: capacitance insulating film; 4a, 4b, and 4c: aluminum oxide film; 5a, 5b, and 5c: zirconium oxide film; 6: adhesive layer; 51: lower electrode; 52: upper electrode; 53a and 53b: aluminum oxide film; 54a and 54b: zirconium oxide film; 55: capacitance insulating film; 101: semiconductor substrate; 103: isolation region; 104: first inter-layer insulating film; 104A: bit-line contact plug; 105: gate electrode; 105a: gate insulating film; 105b: side wall; 105c: insulating film; 106: bit line; 107: second inter-layer insulating film; 107A: capacitance contact plug; 108: source drain regions; 109: substrate contact plug; 111: third inter-layer insulating film; 112: fourth inter-layer insulating film; 112A: opening; 113: lower electrode; 114: capacitance insulating film; 115: upper electrode; 120: fifth inter-layer insulting film; 121: wire layer; 122: surface protection film; 205a, 205b, and 205c: subtract contact portion; 500: data processing system; 510: system bus; 520: calculation processing device; 530: DRAM element; 540: ROM (Read Only Memory); 550: nonvolatile memory device; 560: input and output device; Cap: capacitor element; K: active region; Tr1: MOS transistor; W: word wire.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In addition, the exemplary embodiments below will be explained by dividing them into a plurality of sections or embodiments if necessary for convenience. They should not be construed as not being related to one another, and are in relations of modified embodiments of parts or the entirety thereof, detailed explanation, and supplemental explanations, etc., unless otherwise expressly described herein.

(First Exemplary Embodiment)

The present exemplary embodiment describes a manufacturing method where a capacitance insulating film of a capacitor is formed with a structure of laminating an aluminum oxide film (first metal oxide film) and a zirconium oxide film (second metal oxide film).

FIG. 1 is a schematic cross-sectional view showing a structure of a capacitor formed in the present exemplary embodiment. A capacitor is formed by sandwiching capacitance insulating film 3 between lower electrode 1 made of titanium nitride and upper electrode 2 made of titanium nitride. Capacitance insulating film 3 is formed by alternatively depositing aluminum oxide films (4a, 4b, 4c) and zirconium oxide films 5a, 5b, 5c.

Figure 2:
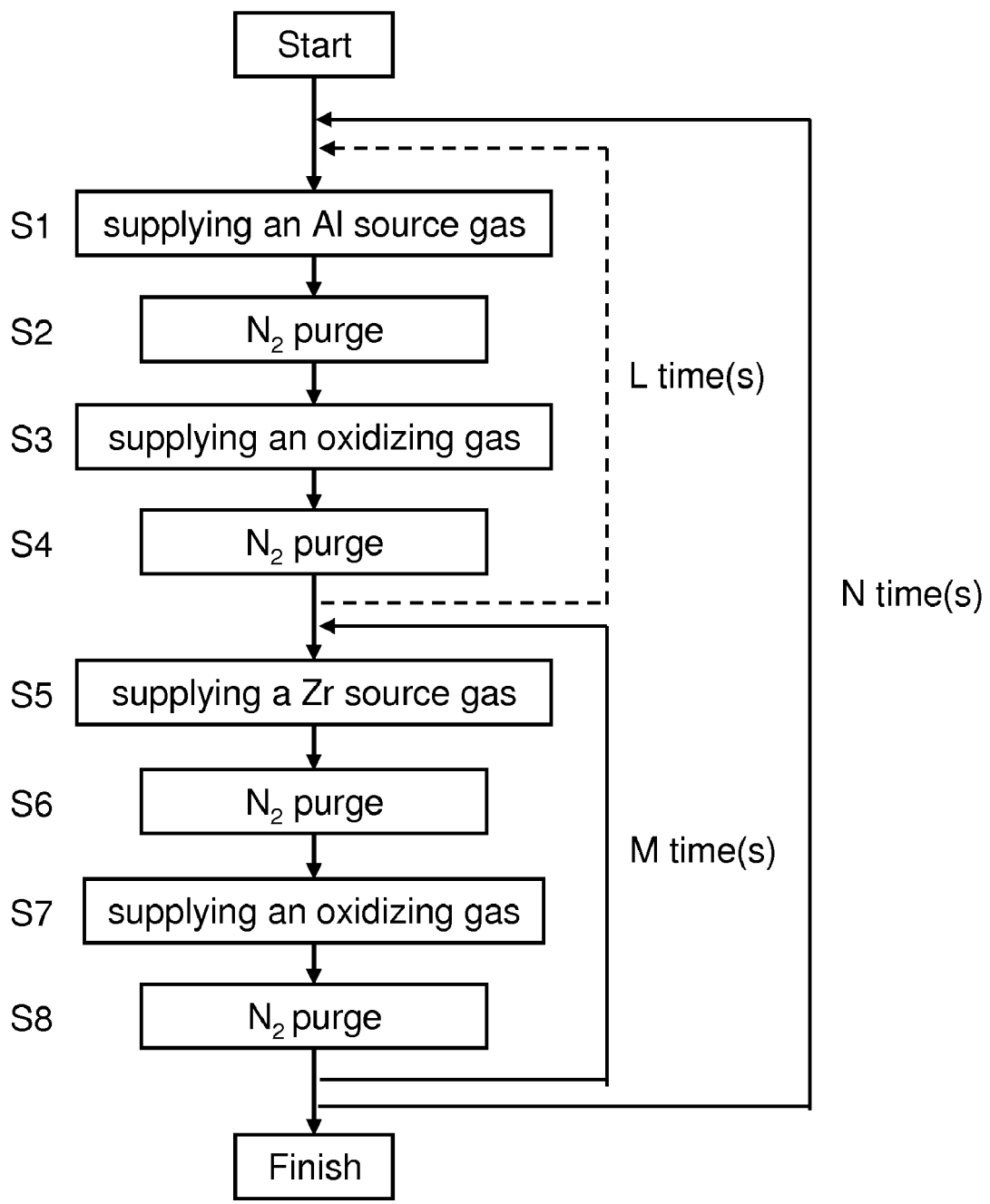
FIG. 2 is a flowchart showing a manufacturing method of a semiconductor device of a first exemplary embodiment.

Adhesive layer 6 is formed between aluminum oxide film 4a of the lowest layer and lower electrode 1. Adhesive layer 6 is an insulating film and functions as part of a dielectric film provided between electrodes of the capacitor. However, as explained below, adhesive layer 6 is a film formed mostly by oxidization of the surface of lower electrode 1 during deposition of aluminum oxide film 4a. Hereinafter, capacitance insulating film 3 is defined to only include a metal oxide film deposited by an ALD (Atomic Layer Deposition) method and does not include adhesive layer 6. FIG. 2 shows a process flowchart for forming capacitance insulating film 3.

Firstly, a semiconductor substrate, on which a pattern of lower electrode 1 is formed by using titanium nitride, is prepared and installed in a reaction chamber of an ALD apparatus. Subsequently, steps S1 to S8 using the ALD method as set forth below are performed. For the ALD apparatus, any of a batch type apparatus or a single wafer type apparatus can be used. Time for supplying source gases, etc., and flow rates thereof may be set to be suitable for a usable ALD apparatus.

Step S1:

The temperature of the reaction chamber is set at 250° C., and TMA (trimethyl·aluminum; TMA corresponds to first source gas) is supplied as aluminum source gas into the reaction chamber. Supplied TMA is chemically absorbed on the surface of the semiconductor substrate comprising lower electrode 1, and a thin film (corresponds to first metal film) as thick as about one aluminum atomic layer is formed.

Step S2:

Nitrogen ($N_2$) is supplied as purging gas into the reaction chamber, and the TMA gas that has not been absorbed and remained during step S1 is exhausted from the reaction chamber.

Step S3:

In the state that the temperature of the reaction chamber is set at 250° C., ozone ($O_3$) is supplied as first oxidizing gas into the reaction chamber. Due to the supplied ozone, the TMA absorbed on the surface of the lower electrode during step S1 is oxidized so that aluminum oxide ($Al_2O_3$; $Al_2O_3$ corresponds to first metal oxide film) is formed. In which case, oxidization reaction also occurs on the interface between the lower electrode and the TMA film absorbed thereon, and the titanium nitride constituting the lower electrode is oxidized so that an oxide film (adhesive layer 6) containing the material (titanium) of the lower electrode is formed. In the present exemplary embodiment, adhesive layer 6 mostly consists of titanium oxide ($TiO_2$). The adhesive layer may contain nitrogen (N) contained in the titanium nitride constituting the lower electrode. The thickness of adhesive layer 6 is adjustable by setting the temperature, especially, during step S3. If the temperature is set at 250° C., an oxide film containing titanium having an approximately 0.3 nm thickness is finally formed.

In the present exemplary embodiment, during an oxidization process after absorption of the metal material (TMA in the present exemplary embodiment) of the metal oxide film of the lowest layer provided directly above lower electrode 1, an oxide film containing the material of the lower electrode is formed as adhesive layer 6 on the interface between the metal oxide film and the lower electrode. However, Japanese Patent Laid-Open No. 2007-201083 discloses forming an oxide film in advance on a lower layer and then performing absorption and oxidization of the metal material by using the ALD method. Compared to the case where an oxide film is formed in advance on the lower layer and then a metal oxide film is formed thereon by using the ALD method as disclosed in Japanese Patent Laid-Open No. 2007-201083, if the method of the present invention is applied, strong and firm adhesive layer 6 can be formed, and the effect in inhibiting film peel-off of the lower electrode and the metal oxide film can be improved.

Step S4:

Nitrogen ($N_2$) is supplied as purging gas into the reaction chamber, and the ozone gas that has not contributed to the oxidization reaction and remained during step S3 is exhausted from the reaction chamber.

Steps S1 to S4 are continuously performed once so that aluminum oxide film 4a having an approximately 0.1 nm thickness is formed. In the present exemplary embodiment, steps S1 to S4 are performed only once. If necessary, of course, steps S1 to S4 may be repeated a plurality of times to increase the thickness of aluminum oxide film 4a. In other words, aluminum oxide film 4a having a desired thickness can be formed by performing steps S1 to S4 as one cycle L time(s) (L is an integer of 1 or more). If the cycle is repeated twice or more times, the thickness of the adhesive layer will increase due to heat addition each time that step S3 of each cycle is performed. Thus, the number of times of cycles should be determined in consideration of the thickness of adhesive layer 6 to be finally formed.

Step S5:

The temperature of the reaction chamber is set at 220° C., and TEMAZ (tetrakisethylmethylzirconium; TEMAZ corresponds to second source gas) is supplied as zirconium source gas into the reaction chamber. The reason for lowering the temperature in step S5 compared to the temperature for forming an aluminum oxide film is to prevent autolysis of the TEMAZ gas due to high temperature. Supplied TEMAZ is chemically absorbed on the surface of the semiconductor substrate comprising the surface of already formed aluminum oxide film 4a so that a thin film (corresponds to second metal film) as thick as about one zirconium atomic layer is formed.

Step S6:

Nitrogen ($N_2$) is supplied as purging gas into the reaction chamber, and the TEMAZ gas that has not been absorbed and remained during step S5 is exhausted from the reaction chamber.

Step S7:

In the state that the temperature of the reaction chamber is set at 220° C., ozone ($O_3$) is supplied as second oxidizing gas into the reaction chamber. Due to the supplied ozone, the TEMAZ absorbed on the surface during step S5 is oxidized so that zirconium oxide ($ZrO_2$; $ZrO_2$ corresponds to second metal oxide film) is formed.

Step S8:

Nitrogen ($N_2$) is supplied as purging gas into the reaction chamber, and the ozone gas that has not contributed to the oxidization reaction and remained during step S7 is exhausted from the reaction chamber.

In the present exemplary embodiment, steps S5 to S8 are continuously performed five times so that zirconium oxide film 5a having an approximately 0.7 nm thickness is formed. Zirconium oxide film 5a having a desired thickness can be formed by performing steps S5 to S8 as one cycle M time(s) (M is an integer of 1 or more).

Subsequently, forming the aluminum oxide film of steps S1 to S4 and forming the zirconium oxide film of steps S5 to S8 were repeated so that capacitance insulating film 3 is formed. The capacitance insulating film 3 includes three aluminum oxide films and three zirconium oxide films and is laminated film in which each of aluminum oxide films and each of zirconium oxide films are alternatively laminated.

Each of aluminum oxide films 4a, 4b, 4c is formed by setting the temperature at 250° C. and performing steps S1 to S4 as one cycle, and has an approximately 0.1 nm thickness. Each of zirconium oxide films 5a, 5b, 5c is formed by setting the temperature at 220° C. and performing steps S5 to S8 as one cycle five times, and has an approximately 0.7 nm thickness.

The number of laminated aluminum oxide films and the number of laminated zirconium oxide films may be more than or less than three. In steps S1 to S8, two kinds of films, i.e., aluminum oxide films and zirconium oxide films, were laminated. However, three or more kinds of films may be laminated.

By performing the cycle of steps S1 to S4 and the cycle of steps S5 to S8 as one set N time(s) (N is an integer of 1 or more), a capacitance insulating film having the desired number of laminated films can be formed.

In FIG. 2, capacitance insulating film 3 is formed under the condition that L32 1, M=5, and N=3 in accordance with the present exemplary embodiment. If upper electrode 2 is formed by using titanium nitride after forming capacitance insulating film 3, a capacitor element is completed.

For the purging gas used in steps S2, S4, S6, and S8, inert gas (Ar, etc.), as well as nitrogen, can be used. In the case where N is an integer of 2 or more, the thickness of the first metal oxide film may be changed by changing the number of the steps S1 to S4 cycles (L) each time that the first metal oxide film is formed. Similarly, the thickness of the second metal oxide film may be changed by changing the number of the steps S5 to S8 cycles (M) each time that the second metal oxide film is formed. As the number of cycles (L) and the number of cycle sets (N) increase, time for addition of heat to the lower electrode in step S3 increases. Thus, as L and N increase, the thickness of the adhesive layer increases.

Examples of more detailed conditions set to carry out the present invention will be described below.

For the ALD apparatus, a vertical batch-type apparatus was used.

A plurality of semiconductor substrates, in which a lower electrode was formed by using titanium nitride, are installed in the reaction chamber, and nitrogen gas is supplied into the reaction chamber. The pressure in the reaction chamber maintains at approximately 80Pa to 90Pa (0.6Torr to 0.7Torr), and the temperature is stabilized at 250° C. In the state that supplying the nitrogen gas is stopped while the pressure in the reaction chamber maintains, TMA gas is supplied for 30 seconds (step S1).

Nitrogen for purge is supplied to exhaust the TMA gas. The pressure in the reaction chamber is set at approximately 190Pa to 200Pa (1.4Torr to 1.5Torr), and the temperature maintains and is stabilized at 250° C. (step S2).

In the state that supplying the nitrogen gas is stopped while the pressure in the reaction chamber maintains, ozone is supplied for 30 seconds (step S3).

Nitrogen for purge is supplied to exhaust the ozone gas. The pressure in the reaction chamber is set at approximately 80Pa to 90Pa (0.6Torr to 0.7Torr), and the set temperature is changed to and stabilized at 220° C. (step S4).

In steps S5 to S8, the same pressure as set in steps S1 to S4 is set. In the state that the temperature maintains at 220° C., TEMAZ gas is supplied for 30 seconds (step S5), and ozone gas is supplied for 30 seconds (step S7). After steps S5 to S8 are repeated five times, nitrogen gas is supplied. The pressure in the reaction chamber maintains at approximately 80Pa to 90Pa (0.6Torr to 0.7Torr), and the temperature is stabilized at 250° C. Thereafter, steps S1 to S4 are performed for the second time.

As a result of depositing lamination films in accordance with the set number of repetition times, i.e., L=1, M=5, and N=3, an oxide film (adhesive layer) containing titanium having an approximately 0.3 nm thickness is finally formed on the surface of the lower electrode.

The thickness of adhesive layer 6 can be adjusted by changing the time for supplying oxide gas in step S3, as well as the temperature in the reaction chamber. By prolonging the time for supplying oxidizing gas, adhesive layer 6 can be thick. Thus, the temperature in step S3 and the time for supplying oxidizing gas may be set to obtain a desired thickness of the adhesive layer.

Furthermore, in the aspect of preventing pyrolysis of a source that may occur upon forming a film according to usable source gas, in the case where an upper limit exists with respect to temperature set during a process of supplying source gas and a subsequent process of oxidization, temperature during each process and time for supplying gas have only to be set while not exceeding the upper limit.

It is possible to set different temperatures for the process of supplying source gas (step S1) and the subsequent process of oxidization (step S3). However, as the number of times for changing temperature increases, time required to form a film is prolonged. Thus, it is preferable to set identical temperature for the process of supplying source gas (step S1) and the subsequent process of oxidization (step S3). Likewise, in the aspect of reducing process time, it is preferable to set an identical temperature condition for steps S5 and S7.

Figure 3:
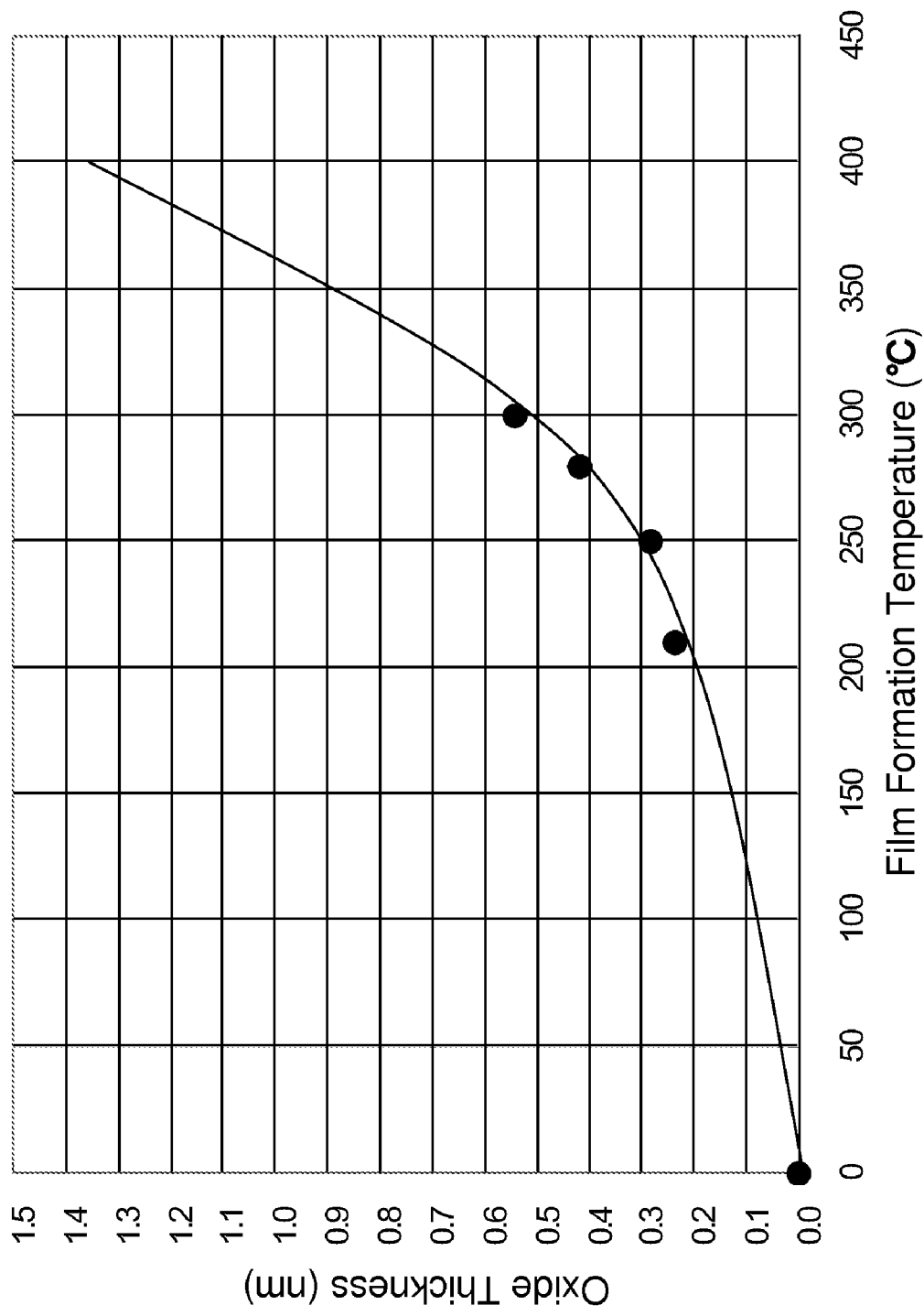
FIG. 3 shows the correlation between the thickness of an adhesive layer and the film formation temperature.

FIG. 3 shows the measurement results of the correlation between the temperature in the reaction chamber during step S3 and the thickness of adhesive layer 6 formed on the lower electrode in the case where a capacitance insulting film containing aluminum oxide films 4a, 4b, 5c was formed under the condition that L=1, M=5, and N=3. From the present exemplary embodiment, it is confirmed that a 0.3 nm or more thickness of the adhesive layer can be obtained by setting the temperature at 250° C. or more. Since the adhesive layer is formed during the process of supplying oxidizing gas (step S3), the temperature during at least step S3 only needs to be 250° C. or more.

Figure 4:
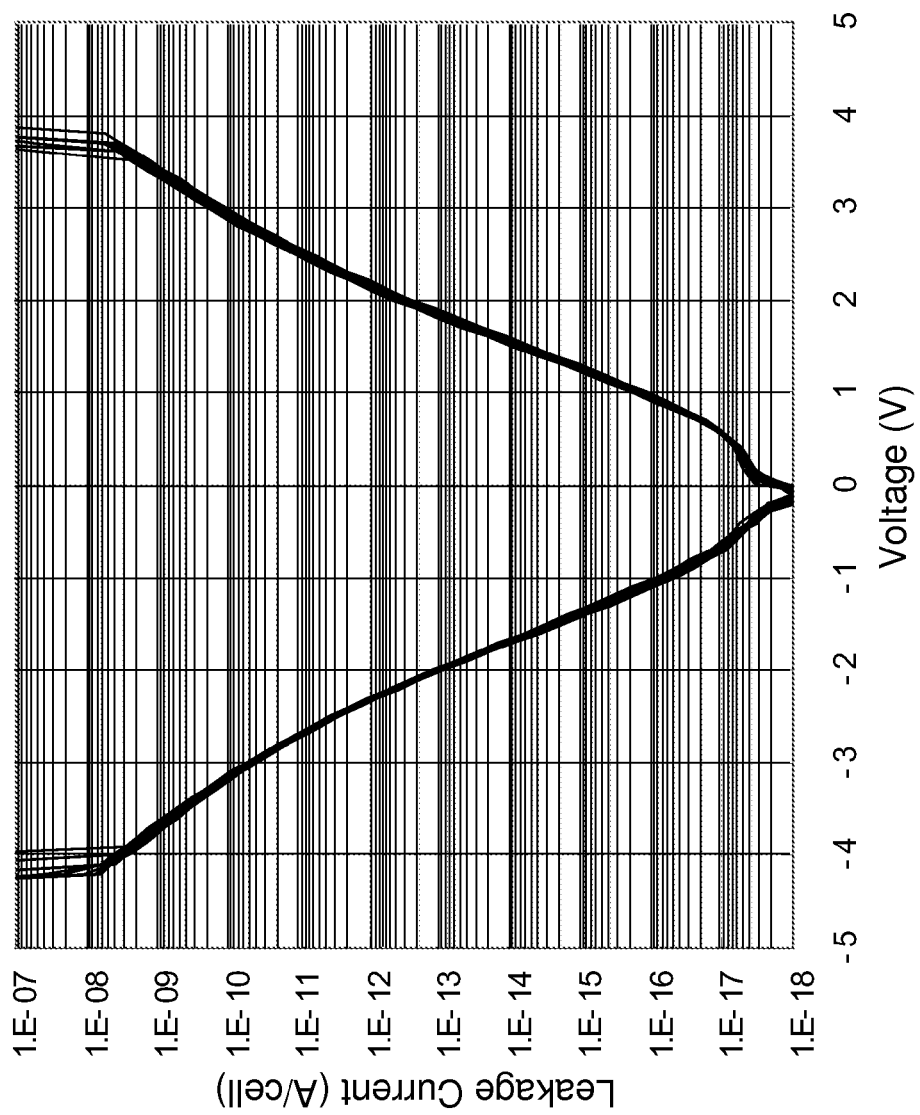
FIG. 4 shows measurement results for leakage current of a semiconductor device of a first exemplary embodiment.

The thickness of the adhesive layer was confirmed by using a transmission electron microscope (TEM). FIG. 4 shows the results of measuring leakage current characteristics of a plurality of capacitors in the case where an adhesive layer having a 0.3 nm thickness was formed (The measuring method is the same as used in FIG. 12 described later).

Figure 11:
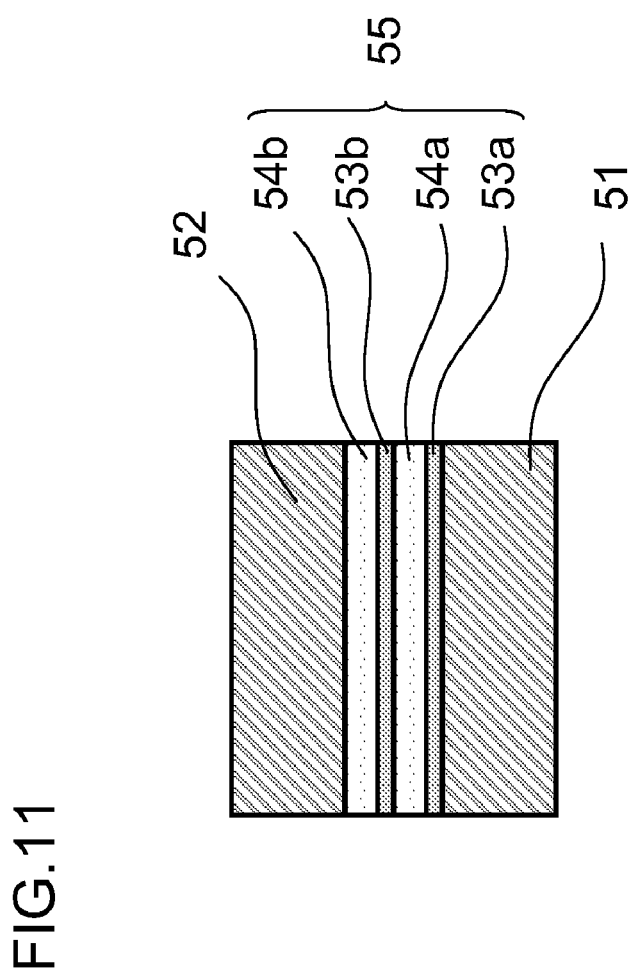
FIG. 11 is a cross-sectional view of a semiconductor device of a comparative embodiment.

With regard to a comparative embodiment, as illustrated in FIG. 11, a capacitor was formed by sandwiching zirconium oxide ($ZrO_2$) and aluminum oxide ($Al_2O_3$) between two electrodes. Capacitance insulting film 55 having a laminated structure was formed on lower electrode 51 formed of titanium nitride (TiN) by using the ALD method, and upper electrode 52 formed of titanium nitride was further provided. Capacitance insulating film 55 had a laminated structure of aluminum oxide films 53a, 53b and zirconium oxide films 54a, 54b. In depositing the capacitance insulating film, the temperature in the reaction chamber of the ALD apparatus was maintained at 210° C., which is desirable to form aluminum oxide films and zirconium oxide films. For oxidizing gases of source gases of the aluminum oxide and the zirconium oxide, ozone ($O_3$) was used. For source gas of the zirconium oxide, TEMAZ (tetrakisethylmethylzirconium) was used. For source gas of the aluminum oxide, TMA (trimethylaluminum) was used. In that case, the thickness of the adhesive layer was approximately 0.2 nm.

Figure 12:
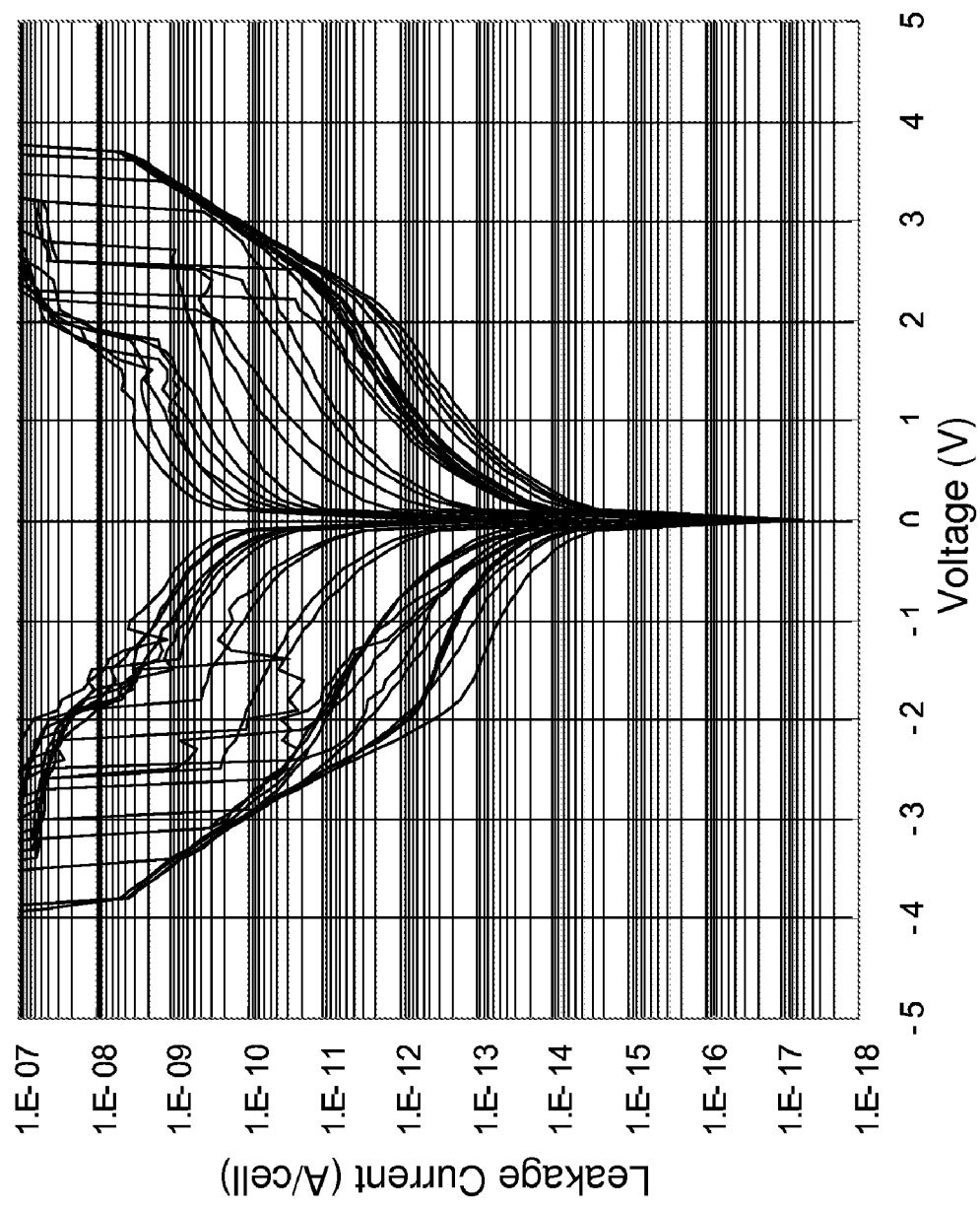
FIG. 12 shows measurement results for leakage current of a semiconductor device of a comparative embodiment.

In the state that one of the electrodes of the manufactured capacitor was in the ground state (GND potential), and −4 V to +4 V of voltage was applied to the other electrode, the leakage current was measured. FIG. 12 shows the overlapping results of measuring leakage current of a plurality of capacitors manufactured under the same condition. The vertical axis indicates a leakage current value per cell in the case where the capacitors were used for DRAM memory cells. From FIG. 12, it is confirmed that since the nonuniformity of the leakage current was significant due to the capacitors, and the leakage current value was large, the capacitors could not be used for a DRAM.

In order to see the cause of the results, the state of the interface between lower electrode 51 and aluminum oxide film 53a was observed by using a transmission electron microscope. As a result, logical film peel-off between lower electrode 51 and aluminum oxide film 53a occurred. On the other hand, no film peel-off between upper electrode 52 and zirconium oxide film 54b was found. Although the cause of the film peel-off is not clear, it is assumed that the peel-off caused damage on the interface between aluminum oxide film 53a and lower electrode 51, and thereby resulting in the significant nonuniformity of the leakage current.

From FIG. 4, it is confirmed that by providing the adhesive layer having a 0.3 nm thickness between the lower electrode and the metal oxide film of the lowest layer, the absolute value of the leakage current decreased, and the nonuniformity thereof was remarkably reduced.

Likewise, for known materials, other than titanium nitride, useful for the lower electrode, a 0.3 nm or more thickness of the adhesive layer can be obtained by properly setting the temperature during step S3 and the time for supplying oxidizing gas such as ozone. As a result of measuring the leakage current of the capacitor element including the adhesive layer having a 0.3 nm or more thickness, a good leakage current characteristic, in which nonuniformity is not present, was obtained as shown FIG. 3.

That is, by forming the adhesive layer having a 0.3 nm or more thickness and containing the element of the lower electrode on the interface between the lower electrode and the metal oxide film of the lowest layer, film peel-off between the lower electrode and the metal oxide film can be prevented, and the leakage current characteristic of the capacitor can be improved. As a result, a semiconductor device having an excellent electrical characteristic and high reliability can be easily manufactured.

In addition, since most insulating films, which function as an adhesive layer, have lower permittivity than that of a capacitance insulating film, they inhibit reduction of capacitance. Thus, the thickness of an adhesive layer is preferably in a range of 0.3 nm to 1.0 nm, more preferably, 0.3 nm to 0.6 nm.

In the present exemplary embodiment, a lower electrode formed of materials other than titanium nitride is also applicable. Specifically, if surface of a lower electrode is formed of metal films, such as ruthenium (Ru), platinum (Pt), tantalum nitride (TaN), iridium (Ir), and tungsten (W), or polycrystalline silicon, the lower electrode is also applicable.

The metal oxide film to be formed is not limited to aluminum oxide and zirconium oxide. Specifically, a metal oxide film formed by using metal selected from a group consisting of titanium (Ti), aluminum (Al), hafnium (Hf), zirconium (Zr), tantalum (Ta), and lanthan (La) through the ALD method is applicable. The first source gases are selected from source gases containing their respective corresponding metal materials. For example, a titanium oxide film can be formed by using TTIP (titanium tetraisopropoxide) as titanium source gas and performing oxidization by using ozone, etc. A hafnium oxide film can be formed by using TEMAH (tetrakisethylmethylaminohafnium) as hafnium source gas and performing oxidization by using ozone, etc. In addition, three or more different metal oxide films may be laminated.

The second source gas may contain at least one selected from a group consisting of $Zr(O\text{-}tBu)_4$, $Zr[N(CH_3)_2]_4$, $Zr[N(C_2H_5)(CH_3)]_4$, $Zr[N(C_2H_5)_2]_4$, $Zr(TMHD)_4$, $Zr(OiC_3H_7)_3$ (TMTD), and $Zr(OtBu)_4$. In consideration of film formation, using $Zr[N(C_2H_5)(CH_3)]_4$ (TEMAZ; tetrakisethylmethylzirconium) is preferred. For the oxidizing gas, gas other than ozone may be used. Specifically, ozone diluted with inert gas such as oxygen gas ($O_2$), vapor ($H_2O$), or Ar can be used. If oxidizing gas other than ozone is used, temperature or oxidization time is adjusted to obtain the 0.3 nm or more thickness of the adhesive layer formed on the lower electrode.

In case of alternatively depositing a first metal oxide film and a second metal oxide film on an electrode, the present invention can be most effectively applied if there is no need to change temperature during lamination of a capacitance insulating film as a result of a combination of selected metal source gas, and an adhesive layer having a 0.3 nm or more thickness can be formed as a result of oxidization using ozone at 250° C. or more.

As explained in the First Exemplary Embodiment, in the case where the temperature setting during lamination of a capacitance insulating film needs to be changed, film formation cycles and temperature have to be combined and set to finally form an oxide film (adhesive layer), between a lower electrode and a first metal oxide film, having a 0.3 nm or more thickness and containing the element of the lower electrode, and minimize the influence (prolonging time required for film formation) of the change in the temperature setting to productivity.

(Second Exemplary Embodiment)

With respect to an example of application of the present invention to a semiconductor device, the case where the present invention is applied to a capacitance insulating film of a capacitor element constituting a memory cell of a DRAM element will be described.

Figure 5:
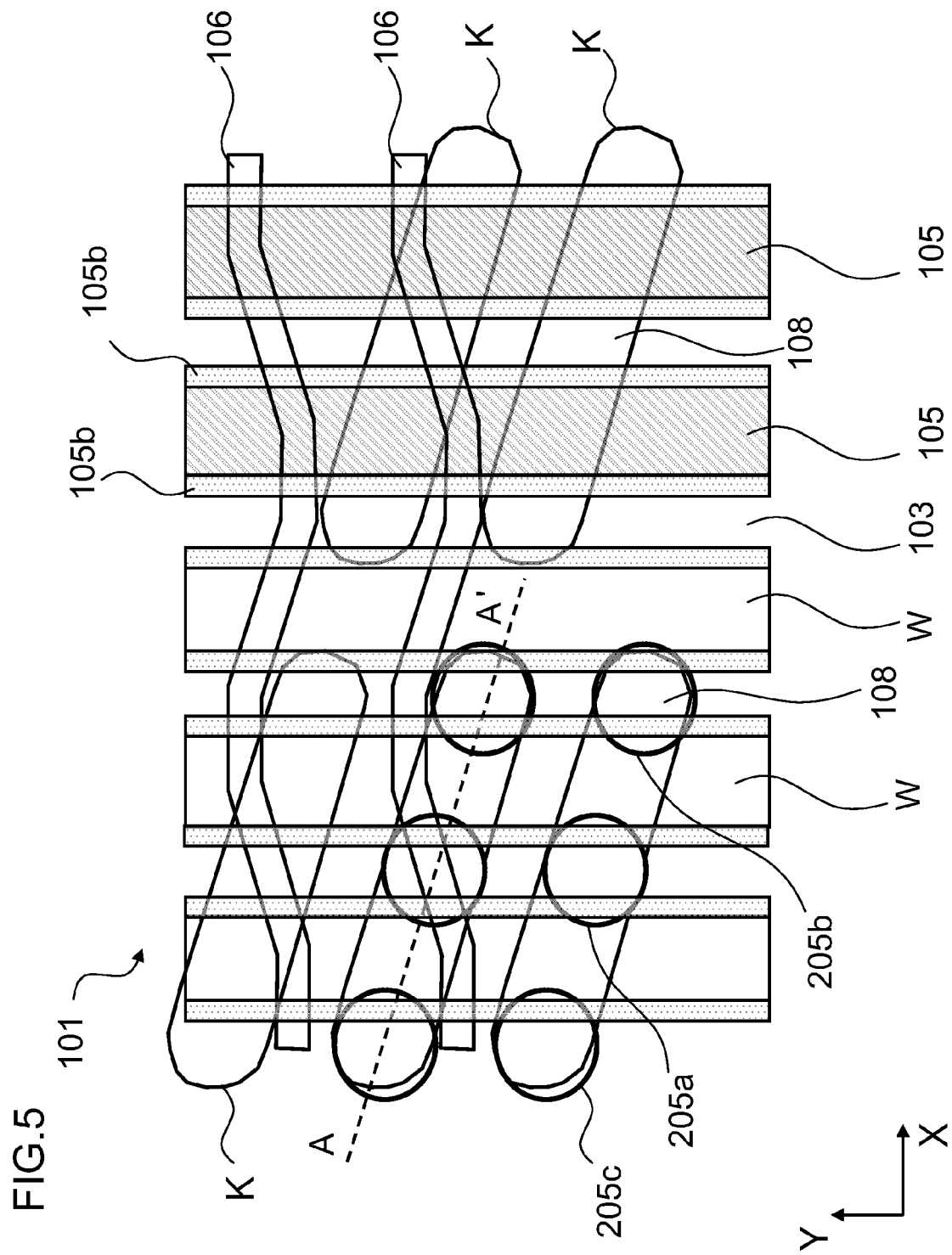
FIG. 5 is a top view of a semiconductor device of a second exemplary embodiment.

FIG. 5 is a conceptual view showing a plane layout of a memory cell region of a DRAM element, as a semiconductor device to which the present invention is applied. The right side of FIG. 5 shows a perspective cross-sectional view based on the cut surface of gate electrode 105 and side wall 105b, which will be word wire (W). For simplification, descriptions of the capacitor element are omitted in FIG. 5 and only present in the cross-sectional view (FIG. 6).

Figure 6:
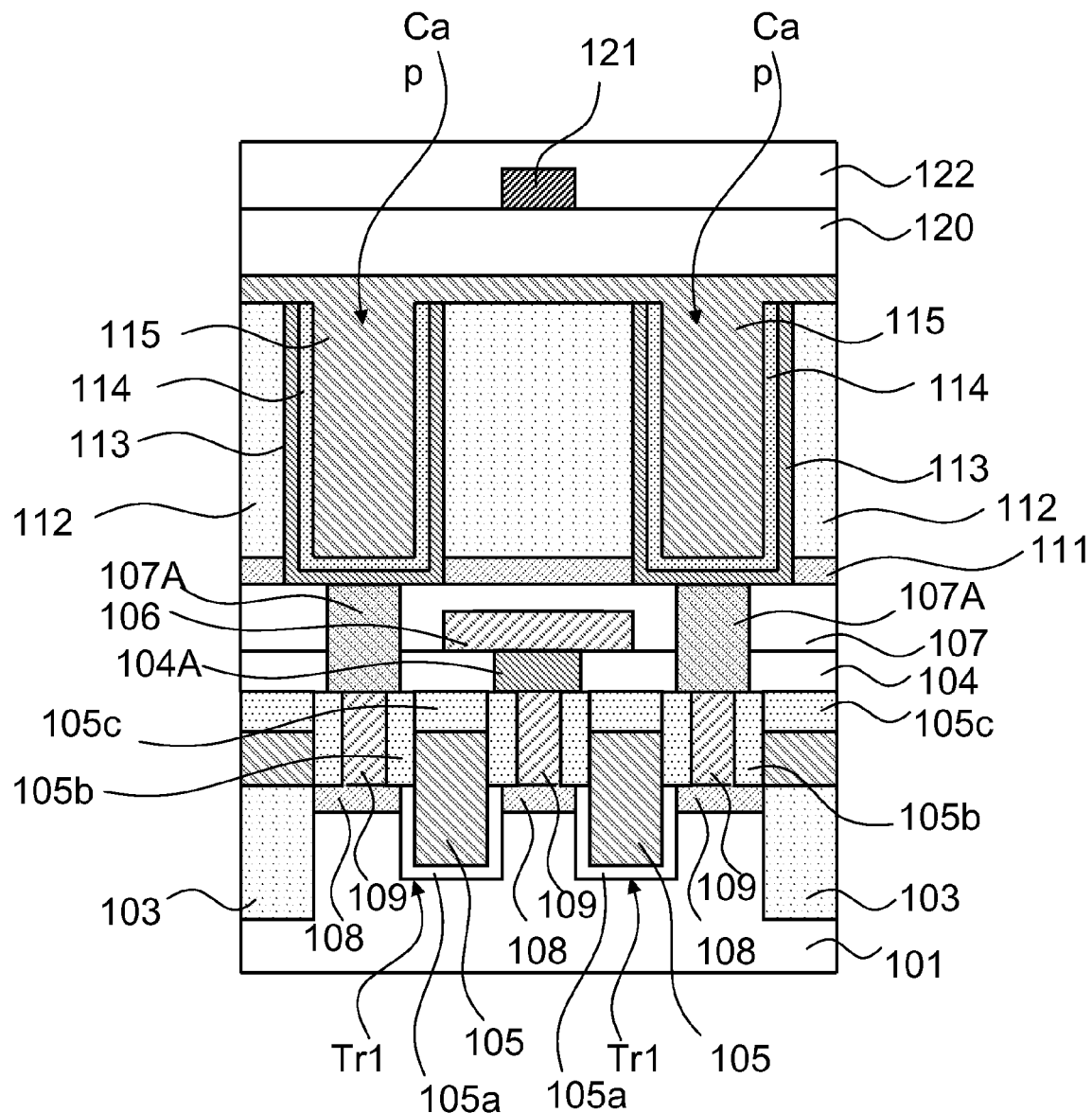
FIG. 6 is a cross-sectional view of a semiconductor device of a second exemplary embodiment.

FIG. 6 is a schematic cross-sectional view corresponding to the A-A' line of the memory cell region (FIG. 5). Since these drawings are intended to explain the constitution of the semiconductor device, scale and dimension, etc., of each portion illustrated in the drawings are different from those of an actually manufactured semiconductor device.

As illustrated in FIG. 6, the memory cell region largely includes MOS transistors (Trl) for a memory cell and capacitor elements Cap connected to the MOS transistors (Trl) through a plurality of contact plugs. In FIGS. 5 and 6, semiconductor substrate 101 is formed of silicon (Si) containing a predetermined concentration of p-type impurity. Isolation regions 103 are formed on semiconductor substrate 101. Isolation regions 103 are formed in regions other than active regions K by burying an insulating film such as a silicon oxide film ($SiO_2$) on the surface of semiconductor substrate 101 through a STI (Shallow Trench Isolation) method, and insulatively isolate the regions from neighboring active regions K. The present exemplary embodiment relates to an example of application of the present invention to a cell structure in which a two-bit memory cell is positioned in one active region K.

In the present exemplary embodiment, as illustrated in FIG. 5, a plurality of active regions K in a slim and long strip shape are inclined downwardly toward the right side while being spaced from one another, and are arranged in accordance with the layout generally called as a 6F2 memory cell.

Impurity diffusion layers are formed on both the ends and the central portion of each of active regions K and function as source•drain regions of MOS transistors Trl. The positions of substrate contact portions 205a, 205b, 205c are defined such that they are positioned on the source•drain regions (impurity diffusion layers).

Bit wires 106 in a curved-line shape extend in the horizontal X direction of FIG. 5. The plurality of bit lines 106 are arranged with predetermined spaces therebetween in the vertical Y direction of FIG. 5. Word wires W in the shape of a straight-line extending in the vertical Y direction of FIG. 5 are arranged. Word wires W are arranged with predetermined spaces therebetween in the horizontal X direction of FIG. 5. Word wires W is configured to include gate electrodes 105 illustrated in FIG. 6 at portions, over which active regions K cross. In the present exemplary embodiment, MOS transistors Trl comprise trench-type gate electrodes.

As illustrated in the cross-sectional structure of FIG. 6, in semiconductor substrate 101, impurity diffusion layers 108 functioning as source•drain regions are formed while being spaced from one another in active regions K partitioned by isolation regions 103. Trench-type gate electrodes 105 are formed between impurity diffusion layers 108.

Gate electrodes 105 are formed of a multi-layer film of a polycrystalline silicone film and a metal film and projected from the top portion of semiconductor substrate 101. The polycrystalline silicone film can be formed by introducing impurities such as phosphorus when forming a film by a CVD method. For the metal film useful for the gate electrodes, tungsten (W) or high melting point metals such as tungsten nitride (WN) and tungsten silicide (WSi) can be used.

As illustrated in FIG. 6, gate insulating film 105a is formed between gate electrode 105 and semiconductor substrate 101. In addition, side wall 105b made of an insulating film such as silicon nitride ($Si_3N_4$) is formed on the side wall of gate electrode 105. Insulating film 105c such as silicon nitride is also formed on gate electrode 105 to protect the top surface of gate electrode 105.

Impurity diffusion layer 108 is formed by introducing, for example, phosphorus as n-type impurity on semiconductor substrate 101. Substrate contact plug 109 is formed to contact with impurity diffusion layer 108. Substrate contact plug 109 is provided in the position of substrate contact portion 205c, 205a, 205b illustrated in FIG. 5 and formed of polycrystalline silicon containing phosphorus. The horizontal X width of substrate contact plug 109 has a self-align structure defined by side wall 105b provided in neighboring gate wire W.

As illustrated in FIG. 6, first inter-layer insulating film 104 is formed to cover insulating film 105c on the gate electrode and substrate contact plug 109. Bit-line contact plug 104A is formed passing through first inter-layer insulating film 104. Bit-line contact plug 104A is provided in the position of substrate contact portion 205a and conductive to substrate contact plug 109. Bit-line contact plug 104A is formed by laminating tungsten (W), etc., on a barrier film (TiN/Ti) consisting of a laminated film of titanium (Ti) and titanium nitride (TiN). Bit wire 106 is formed to be connected with bit-line contact plug 104A. Bit wire 106 is formed of a laminated film including tungsten nitride (WN) and tungsten (W).

Second inter-layer insulating film 107 is formed in order to cover bit wire 106. Capacitance contact plug 107A is formed to pass through first inter-layer insulating film 104 and second inter-layer insulating film 107 and be connected to substrate contact plug 109. Capacitance contact plug 107A is provided in the position of substrate contact portion 205b, 205c.

Third inter-layer insulting film 111 including silicon nitride and fourth inter-layer insulating film 112 including a silicon oxide film are formed on second inter-layer insulating film 107. Capacitor element Cap is formed to pass through third inter-layer insulating film 111 and fourth inter-layer insulating film 112 and be connected to capacitance contact plug 107A.

Capacitor element Cap is formed between lower electrode 113 and upper electrode 115 by using the method explained in the First Exemplary Embodiment. Specifically, lower electrode 113 and upper electrode 115 are formed by using a titanium nitride film and have a structure in which a laminated film of aluminum oxide (first metal oxide film) and zirconium oxide (second metal oxide film) is sandwiched as capacitance insulating film 114 therebetween. An oxide film (adhesive layer) containing the titanium material of the lower electrode is formed on the interface between lower electrode 113 and the aluminum oxide film of the lowest layer. FIG. 6 illustrates one layer of capacitance insulating film 114 for simplification. FIG. 6 does not illustrate the adhesive layer.

Lower electrode 113 is conductive to capacitance contact plug 107A. Fifth inter-layer insulating film 120 formed of silicon oxide, wire layer 121 of an upper layer formed of aluminum (Al), and copper (Cu), etc., and surface protection film 122 are formed on third inter-layer insulating film 111.

A predetermined potential is applied to upper electrode 115 of the capacitor element. The structure of FIG. 6 functions as a DRAM element by determining an electric charge maintained in the capacitor element and performing information memory.

The detailed method of manufacturing capacitor element Cap will now be described.

Figure 7:
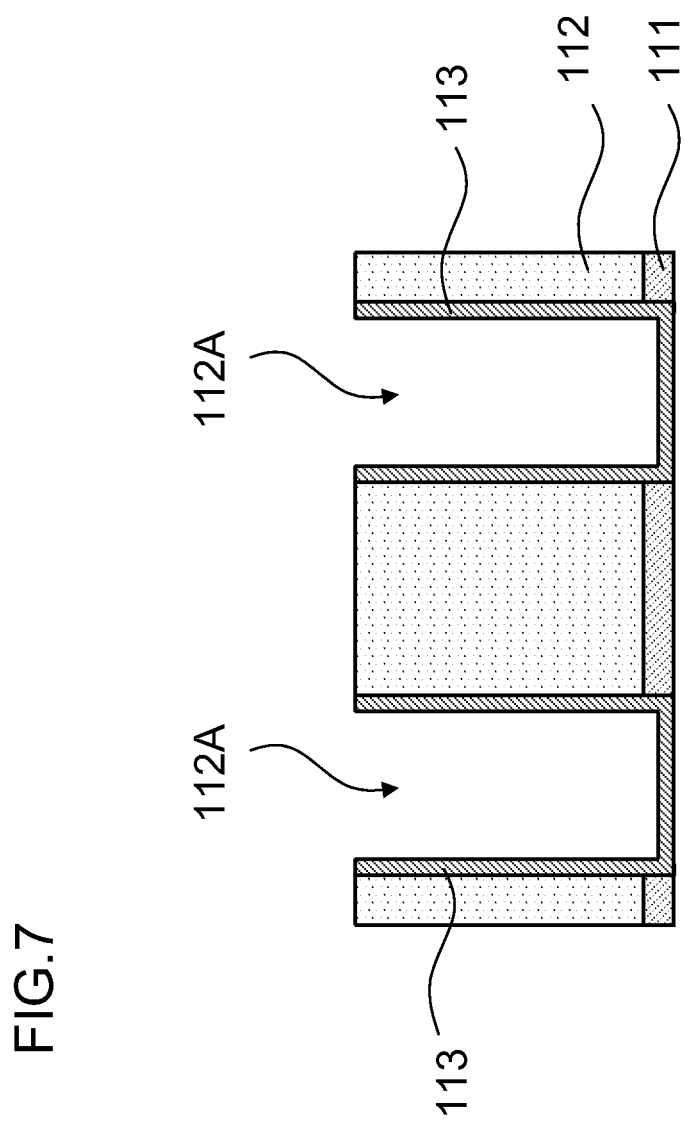
FIG. 7 is a cross-sectional view of one process for a manufacturing method of a semiconductor device of a second exemplary embodiment.
Figure 8:
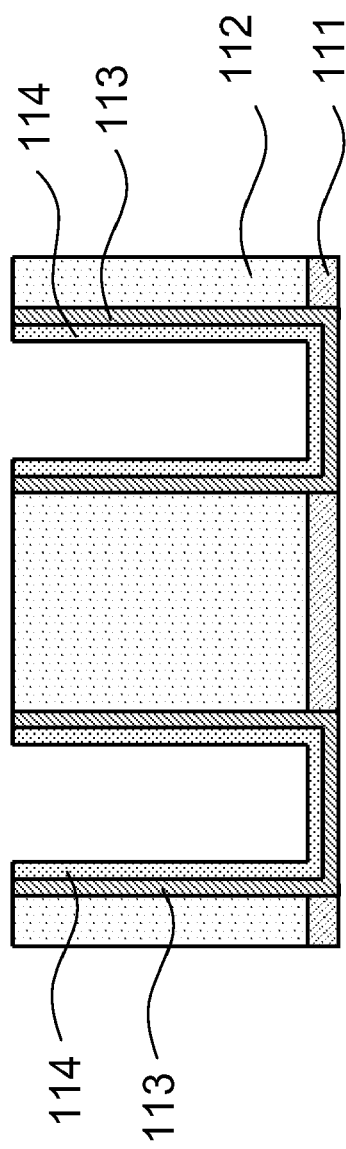
FIG. 8 is a cross-sectional view of one process for a manufacturing method of a semiconductor device of a second exemplary embodiment.
Figure 9:
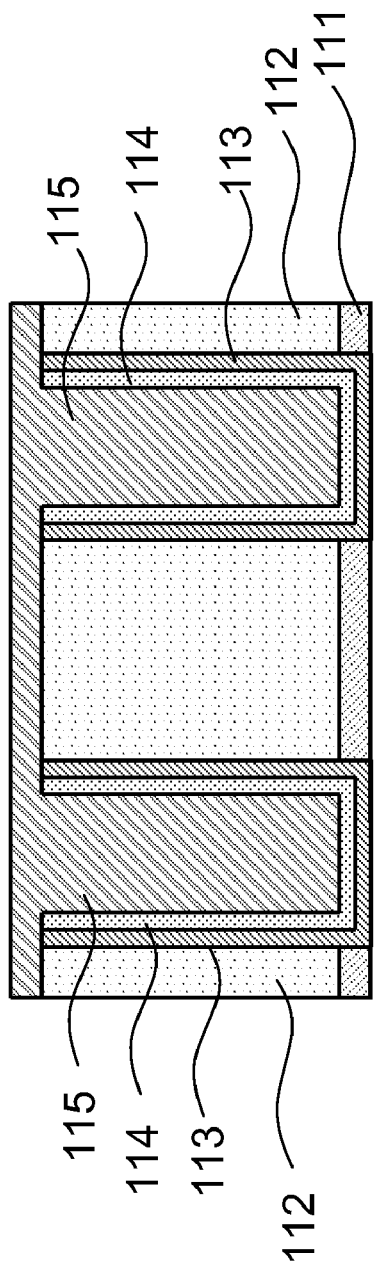
FIG. 9 is a cross-sectional view of one process for a manufacturing method of a semiconductor device of a second exemplary embodiment.

FIGS. 7 to 9 illustrate a sectional view of the upper portions from third inter-layer insulating film 111. Firstly, as illustrated in FIG. 7, third inter-layer insulating film 111 and fourth inter-layer insulating film 112 are deposited with a predetermined thickness, and opening 112A is formed by using a photolithography process to form a capacitor element. Lower electrode 113 is formed while being left only in the interior wall of opening 112A by using a dry-etching technique or a CMP (Chemical Mechanical Polishing) technique. Although titanium nitride was used as material for the lower electrode, other metal films may be used.

Subsequently, as illustrated in FIG. 8, a process of alternatively depositing aluminum oxide film having an approximately 0.1 nm thickness and zirconium oxide film having an approximately 0.7 nm thickness by using the ALD method is repeated to form capacitance insulating film 114, in which three-layer aluminum oxide films and three-layer zirconium oxide films are alternatively formed. By setting the apparatus temperature at 250° C. during the formation of an aluminum oxide film, an adhesive layer (not illustrated) having an approximately 0.3 nm thickness is formed between an aluminum oxide film of the lowest layer and lower electrode 113.

Subsequently, as illustrated in FIG. 9, upper electrode 115 is formed by depositing the same metal film as used for the lower electrode to cover the surface of capacitance insulating film 114 and fill up the inside of opening 112A. Material for upper electrode 115 may be different from that of lower electrode 113. The lower electrode and the upper electrode may be formed of a laminated film of a plurality of metals. As a result, capacitor element Cap is completed.

By applying the present invention, a capacitor element can be formed. This capacitor element has a small leakage current value and a large capacitance value and does not cause film peel-off between capacitance insulating film 114 and lower electrode 113 even in the case where a lower electrode has a three-dimensional structure as illustrated in FIG. 6.

If a DRAM element is formed by using the present invention, an element having high-performance in maintaining data can be easily formed even in case of high integration (micro-fabrication). If a DRAM element manufactured as described above is used, for example, the data processing system described in the Third Embodiment below can be formed.

(Third Exemplary Embodiment)

Figure 10:
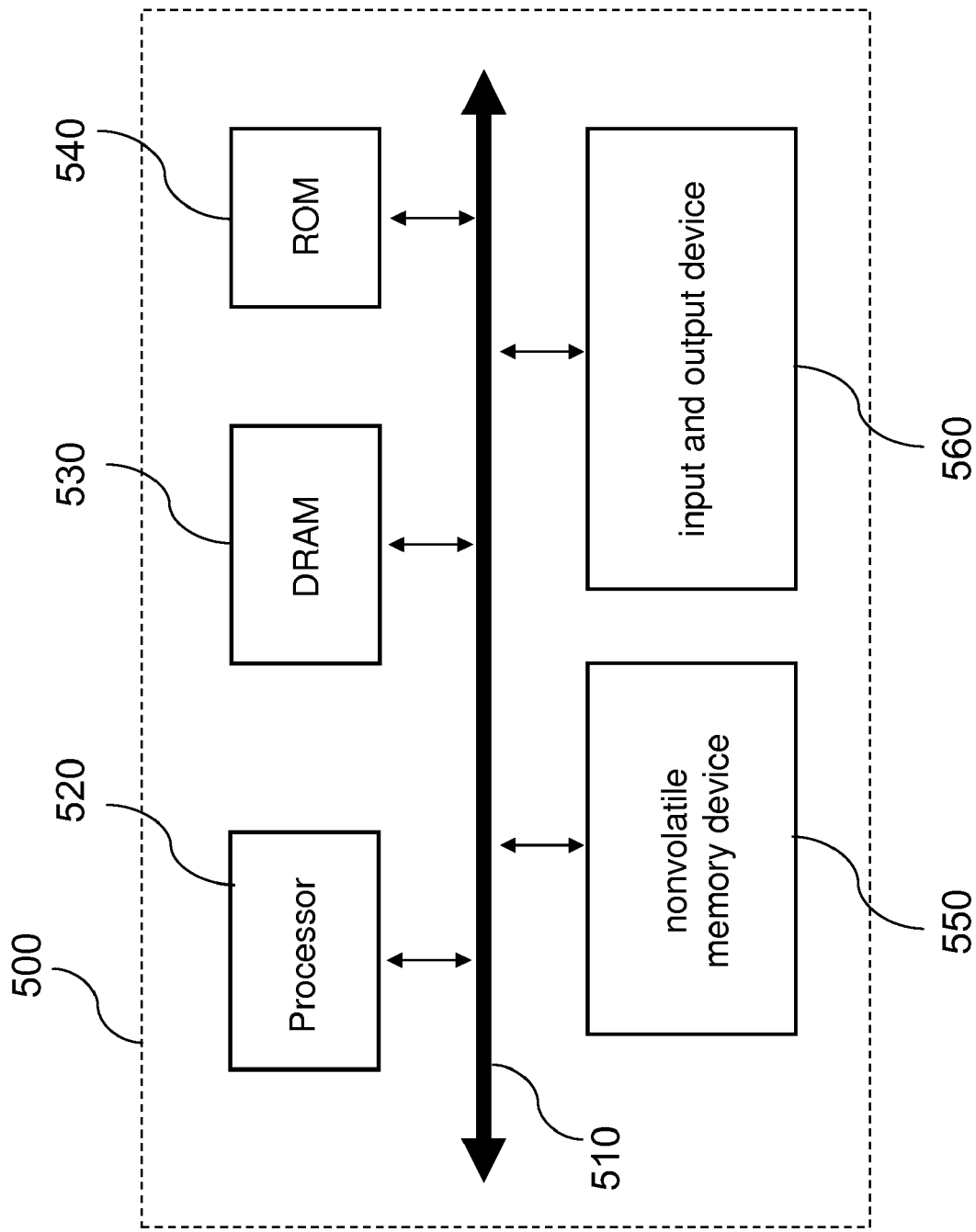
FIG. 10 is a schematic view of a semiconductor device of a third exemplary embodiment.

FIG. 10 shows the outline configuration of data processing system 500 of the present exemplary embodiment. Data processing system 500 comprises calculation processing device 520 and DRAM element 530, which are connected to each other through system bus 510.

Calculation processing device 520 is an MPU (Micro Processing Unit), a DSP (Digital Signal Processor), or the like. DRAM element 530 comprises a memory cell formed by the method explained in the Second Exemplary Embodiment.

For storage of fixed data, ROM (Read Only Memory) 540 may be connected to system bus 510. For simplification, only one system bus 510 is described. However, system busses may be connected to one another in serial or parallel through a connector, etc., if necessary. Devices may be connected to each other by a local bus without using system bus 510.

In data processing system 500, nonvolatile memory device 550 and input and output device 560 are connected to system bus 510. For the nonvolatile memory device, a hard disk, an optical drive, and SSD (Solid State Drive), etc., may be used.

Input and output device 560 includes a display device for liquid crystal display or a data input device such as a keyboard. For simplification, FIG. 10 describes only one component per component of data processing system 500. However, the number of each component of data processing system 500 is not limited to one and includes the case where one or each of all components is plural. Data processing system (500) includes, for example, a computer system, but is not limited thereto.

It is apparent that the present invention is not limited to the above embodiments, but may be modified and changed without departing from the scope and spirit of the invention.

In addition, while not specifically claimed in the claim section, the applications reserve the right to include in the claim section at any appropriate time the following data processing systems:

AA1. A data processing system comprising a calculation processing device and a DRAM device, which are interconnected to the data processing system via a system bus,
the DRAM device comprising a memory cell including a capacitor,
the capacitor comprising:
a lower electrode;
an adhesive layer on the lower electrode;
a first metal oxide film on the adhesive layer;
a second metal oxide film on the first metal oxide film; and
an upper electrode on the second metal oxide film,
wherein the adhesive layer is an oxide film including at least one element selected from elements contained in the lower electrode, a thickness of the adhesive layer being in range from 0.3 nm to 1.0 nm.

AA2. The data processing system of the above AA1, wherein the lower electrode comprises titanium nitride, and the adhesive layer includes titanium.

AA3. The data processing system of the above AA1, wherein both the lower electrode and the adhesive layer include at least one material selected from the group consisting of Ru, Pt, Ta, Ir, and W.

AA4. The data processing system of the above AA1, wherein the first metal oxide film includes at least one first material selected from the group consisting of Ti, Al, Hf, Zr, Ta, and La, and the second metal oxide film includes at least one second material selected from the group consisting of Ti, Al, Hf, Zr, Ta, and La,
wherein the first material is different from the second material.

AA5. The data processing system of the above AA2, wherein the first metal oxide film is an aluminum oxide film, and the second metal oxide film is a zirconium oxide film.

What is claimed is:

1. A semiconductor device comprising:
a capacitor including a lower electrode, an adhesive layer, a capacitance insulating film, and an upper electrode in this order,
wherein the capacitance insulating film includes laminated films, in which a first metal oxide film and a second metal oxide film are alternatively laminated such that the first metal oxide film contacts with the adhesive layer, and
the adhesive layer has thickness of 0.3 nm or more and is an oxide film including at least one element selected from elements contained in the lower electrode.

2. The semiconductor device as claimed in claim 1, wherein the thickness of the adhesive layer is 0.3 nm to 1.0 nm.

3. The semiconductor device as claimed in claim 1, wherein the thickness of the adhesive layer is 0.3 nm to 0.6 nm.

4. The semiconductor device as claimed in claim 1, wherein the first metal oxide film is an aluminum oxide film.

5. The semiconductor device as claimed in claim 4, wherein the second metal oxide film is a zirconium oxide film.

6. The semiconductor device as claimed in claim 1, further comprising a field effect transistor including source/drain regions and a bit line,
wherein one of the source/drain regions is electrically connected to the capacitor,
the other of the source/drain regions is electrically connected to the bit line, and
the field effect transistor and the capacitor constitute a memory cell of a DRAM (Dynamic Random Access Memory).

7. The semiconductor device as claimed in claim 1,
wherein the first metal oxide film includes at least one first material selected from the group consisting of Ti, Al, Hf, Zr, Ta, and La, and the second metal oxide film includes at least one second material selected from the group consisting of Ti, Al, Hf, Zr, Ta, and La,
wherein a total number of the first metal oxide film and the second metal oxide film is not less than four, and
wherein the first material is different form the second material.

8. The semiconductor device as claimed in claim 7,
wherein the capacitance insulating film is free from including PZT as a ferroelectric material.

9. A semiconductor device comprising a capacitor,
the capacitor comprising:
a lower electrode;
an adhesive layer on the lower electrode;
a first metal oxide film on the adhesive layer;
a second metal oxide film on the first metal oxide film; and
an upper electrode on the second metal oxide film,
wherein the adhesive layer is an oxide film including at least one element selected from elements contained in the lower electrode, a thickness of the adhesive layer being in range from 0.3 nm to 1.0 nm.

10. The semiconductor device as claimed in claim 9, wherein the lower electrode comprises titanium nitride, and the adhesive layer includes titanium.

11. The semiconductor device as claimed in claim 10, wherein the first metal oxide film is an aluminum oxide film, and the second metal oxide film is a zirconium oxide film.

12. The semiconductor device as claimed in claim 9, wherein both the lower electrode and the adhesive layer include at least one material selected from the group consisting of Ru, Pt, Ta, Ir, and W.

13. The semiconductor device as claimed in claim 9,
wherein the first metal oxide film includes at least one first material selected from the group consisting of Ti, Al, Hf, Zr, Ta, and La, and the second metal oxide film includes at least one second material selected from the group consisting of Ti, Al, Hf, Zr, Ta, and La so that the first metal oxide film and the second metal oxide film are alternately laminated and a total number of the first metal oxide film and the second metal oxide film is not less than four;
wherein the first material is different from the second material and wherein the capacitor is for DRAM (Dynamic Random Access Memory).

14. The semiconductor device as claimed in claim 13,
wherein the first metal oxide film and the second metal oxide film are free from including PZT as a ferroelectric material.

15. A semiconductor device comprising: a lower electrode having a first portion and a second portion, the first portion being substantially parallel to a surface of a semiconductor substrate and the second portion extending upward from the first portion thereof;
an adhesive layer on the lower electrode of the first portion and the second portion;
a first metal oxide film on the adhesive layer;
a second metal oxide film on the first metal oxide film; and
an upper electrode on the second metal oxide film, wherein a thickness of the adhesive layer is in the range from 0.3 nm to 1.0 nm.

16. The semiconductor device as claimed in claim 15,
wherein both the lower electrode and the adhesive layer include at least one metal selected from the group consisting of Ti, Ru, Pt, Ir and W.

17. The semiconductor device as claimed in claim 15,
wherein the lower electrode comprises titanium nitride, and the adhesive layer includes titanium.

18. The semiconductor device as claimed in claim 15, wherein the thickness of the adhesive layer is in the range from 0.3 nm to 0.6 nm.

19. The semiconductor device as claimed in claim 15, wherein the first metal oxide film is an aluminum oxide film.

20. The semiconductor device as claimed in claim 15, wherein the second metal oxide film is a zirconium oxide film.

21. The semiconductor device as claimed in claim 15, wherein the first metal oxide film includes at least one first material selected from the group consisting of Ti, Al, Hf, Zr, Ta, and La, and the second metal oxide film includes at least one second material selected from the group consisting of Ti, Al, Hf, Zr, Ta, and La so that the first metal oxide film and the second metal oxide film are alternately laminated and a total number of the first metal oxide film and the second metal oxide film is not less than four;
wherein the first material is different form the second material; and
wherein the lower electrode, the adhesive layer, the first metal oxide film, the second metal oxide film and the upper electrode constitute a capacitor for DRAM (Dynamic Random Access Memory).

22. The semiconductor device as claimed in claim 21, wherein the first metal oxide film and the second metal oxide film are free from including PZT as a ferroelectric material.

* * * * *